United States Patent
Yokoyama et al.

(10) Patent No.: US 10,098,254 B2
(45) Date of Patent: Oct. 9, 2018

(54) METHOD OF MANUFACTURING SEMICONDUCTOR DEVICE

(71) Applicant: FUJI ELECTRIC CO., LTD., Kawasaki-shi, Kanagawa (JP)

(72) Inventors: Takeshi Yokoyama, Matsumoto (JP); Takashi Saito, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/692,196

(22) Filed: Aug. 31, 2017

(65) Prior Publication Data

US 2017/0367213 A1 Dec. 21, 2017

Related U.S. Application Data

(63) Continuation of application No. PCT/JP2016/076782, filed on Sep. 12, 2016.

(30) Foreign Application Priority Data

Sep. 17, 2015 (JP) .................................. 2015-183810

(51) Int. Cl.
*H01L 21/00* (2006.01)
*H01L 21/50* (2006.01)
(Continued)

(52) U.S. Cl.
CPC .............. *H05K 7/20* (2013.01); *H01L 21/50* (2013.01); *H01L 23/24* (2013.01); *H01L 23/34* (2013.01);
(Continued)

(58) Field of Classification Search
CPC ......... H01L 23/24; H01L 23/34; H01L 23/40; H01L 23/3735
(Continued)

(56) References Cited

U.S. PATENT DOCUMENTS 7,511,961 B2 * 3/2009 Tschirbs ................ H01L 23/492
361/704
7,906,731 B2 * 3/2011 Matsui ................ F21V 19/0055
174/252
(Continued)

FOREIGN PATENT DOCUMENTS

EP 1434266 A1 6/2004
JP S56-071960 A 6/1981
(Continued)

*Primary Examiner* — Sheikh Maruf
(74) *Attorney, Agent, or Firm* — Rabin & Berdo, P.C.

(57) ABSTRACT

A method of manufacturing a semiconductor device, including preparing a heat-dissipating base, performing a first initial warping or a second initial warping of the heat-dissipating base, soldering a laminated substrate, including a circuit board provided on an insulating board, on the heat-dissipating base after the first or second initial warping, and soldering a semiconductor chip on the circuit board. The first initial warping includes performing shot peening on the rear surface of the heat-dissipating base to form a hardened layer, and subsequently plating the front and rear surfaces of the heat-dissipating base, including the hardened layer formed thereon, with a metal material. The second initial warping includes plating the front and rear surfaces of the heat-dissipating base with the metal material to form a plating layer, and subsequently performing the shot peening on the rear surface of the heat-dissipating base, including the plating layer formed thereon, with the metal material.

10 Claims, 10 Drawing Sheets

(51) Int. Cl.
  *H01L 23/24* (2006.01)
  *H05K 7/20* (2006.01)
  *H01L 23/40* (2006.01)
  *H01L 23/373* (2006.01)
  *H01L 23/34* (2006.01)
  *H01L 23/36* (2006.01)

(52) U.S. Cl.
  CPC .......... *H01L 23/3735* (2013.01); *H01L 23/40* (2013.01); *H01L 23/36* (2013.01); *H01L 2224/04026* (2013.01); *H01L 2224/84801* (2013.01); *H01L 2924/014* (2013.01); *H01L 2924/3511* (2013.01)

(58) Field of Classification Search
  USPC ........................................... 438/118–122, 26
  See application file for complete search history.

(56) References Cited

U.S. PATENT DOCUMENTS

| | | | | |
|---|---|---|---|---|
| 8,745,841 B2* | 6/2014 | Osanai | ............... | B22D 19/0072 164/112 |
| 9,530,741 B2* | 12/2016 | Kim | ...................... | H01L 23/562 |
| 2002/0009826 A1* | 1/2002 | Chien | ................. | H01L 21/4857 438/106 |
| 2004/0144561 A1 | 7/2004 | Osanai et al. | | |
| 2004/0212051 A1* | 10/2004 | Zhao | ........................ | H01L 23/13 257/672 |
| 2008/0291628 A1* | 11/2008 | Aoki | ...................... | H01L 23/473 361/699 |
| 2010/0208427 A1 | 8/2010 | Horiuchi et al. | | |
| 2011/0171785 A1* | 7/2011 | Lin | ........................ | H05K 1/021 438/122 |
| 2011/0287563 A1* | 11/2011 | Lin | ........................ | H01L 21/486 438/26 |
| 2017/0309544 A1* | 10/2017 | Kobayashi | ............ | H01L 23/473 |

FOREIGN PATENT DOCUMENTS

| | | |
|---|---|---|
| JP | 2004-214284 A | 7/2004 |
| JP | 2006-332084 A | 12/2006 |
| JP | 2009-088218 A | 4/2009 |
| JP | 2010-192708 A | 9/2010 |
| JP | 2011-054607 A | 3/2011 |

* cited by examiner

| SHOT MEDIA | | SP PROCESS TYPE | ARITHMETIC MEAN ROUGHNESS Ra(μm) | WARPING | ADHESION OF PLATING LAYER |
|---|---|---|---|---|---|
| SHAPE | MEAN PARTICLE DIAMETER (mm) | | | | |
| SPHERICAL | 1 | AIR PRESSURE | 4 | G | G |
| CYLINDRAL | 0.1 | AIR PRESSURE | 0.8 | P | G |
| BLOCK FRAGMENTS | 0.2 | AIR PRESSURE | 1.04 | G | G |
| BLOCK FRAGMENTS | 0.6 | AIR PRESSURE | 2.64 | G | G |
| BLOCK FRAGMENTS | 3 | ULTRA-SOUND | 7.44 | G | G |
| BLOCK FRAGMENTS | 5 | ULTRA-SOUND | 10.8 | G | G |
| BLOCK FRAGMENTS | 8 | ULTRA-SOUND | 15.6 | P | N |

FIG. 7

| SHOT MEDIA | | SP PROCESS TYPE | ARITHMETIC MEAN ROUGHNESS Ra(μm) | WARPING | ADHESION OF PLATING LAYER |
|---|---|---|---|---|---|
| SHAPE | MEAN PARTICLE DIAMETER (mm) | | | | |
| SPHERICAL | 0.2 | AIR PRESSURE | 0.8 | P | G |
| SPHERICAL | 0.6 | AIR PRESSURE | 2.3 | G | G |
| SPHERICAL | 3 | ULTRA-SOUND | 6.1 | G | G |
| SPHERICAL | 10 | ULTRA-SOUND | 15 | G | G |
| SPHERICAL | 12 | ULTRA-SOUND | 16 | G | P |
| BLOCK FRAGMENTS | 0.6 | AIR PRESSURE | 2.45 | G | N |

FIG. 10

METHOD OF MANUFACTURING SEMICONDUCTOR DEVICE

CROSS-REFERENCE TO RELATED APPLICATION

This application is a continuation application of International Application PCT/JP2016/076782, filed on Sep. 12, 2016, which designated the U.S., and which claims priority to Japanese Patent Application No. 2015-183810, filed on Sep. 17, 2015, the entire contents of which are incorporated herein by reference.

BACKGROUND OF THE INVENTION

1. Field of the Invention

The embodiments discussed herein relate to a method of manufacturing a semiconductor device.

2. Background of the Related Art

A power semiconductor device includes one or more semiconductor chips, a laminated substrate equipped with an insulating board that has a circuit board formed on a front surface thereof and a metal plate formed on a rear surface thereof, and a heat-dissipating base that is provided via solder on the laminated substrate, with the one or more semiconductor chips being mounted via solder on the circuit board. For a power semiconductor device of this configuration, a cooler, such as heat-dissipating fins, is also attached via thermal compound to a rear surface of the heat-dissipating base. The power semiconductor device is also heated to solder the semiconductor chips, the laminated substrate, and the heat-dissipating base together. When doing so, due to the differences in the thermal expansion coefficient between the members, upwardly convex warping occurs in the heat-dissipating base. When gaps are produced between a warped heat-dissipating base and the heat-dissipating fins, the thickness of the thermal compound becomes non-uniform, reducing the ability to dissipate heat.

For this reason, for a power semiconductor device of this configuration where semiconductor chips, a laminated substrate, and a heat-dissipating base are integrated, the rear surface of a heat-dissipating base that has warped to become upwardly convex due to the heating performed to solder the members together is subjected to a shot peening process to form a hardened layer. By producing downwardly convex warping in the heat-dissipating base through this process, it is possible to correct the warping of the heat-dissipating base that has warped to become upwardly convex so as to become substantially horizontal.

In this way, a method that suppresses a drop in heat dissipation by ensuring tight contact via thermal compound between the heat-dissipating base and the heat-dissipating fins is known (see for example, Japanese Laid-open Patent Publication No. 2004-214284).

However, when a shot peening process is performed on the rear surface of a heat-dissipating base after semiconductor chips, a laminated substrate, and the heat-dissipating base have been laminated via solder, there is the risk of the semiconductor chips and the solder being damaged.

SUMMARY OF THE INVENTION

According to an aspect of the present disclosure, there is provided a method of manufacturing a semiconductor device including: preparing a heat-dissipating base; performing a plating process that plates a front surface and a rear surface of the heat-dissipating base with a metal material; performing a shot peening process on the rear surface of the heat-dissipating base before or after performing the plating process; and heating to solder together the heat-dissipating base that has been subjected to the shot peening process, a laminated substrate that has been disposed via solder on the front surface of the heat-dissipating base and includes an insulating board and a circuit board provided on a front surface of the insulating board, and a semiconductor chip that has been disposed via solder on the circuit board.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 depicts the heat-dissipating base when a variety of shot media have been used in the shot peening process according to the first embodiment;

FIG. 10 depicts a heat-dissipating base in a case where a variety of shot media have been used in a shot peening process according to the second embodiment.

DETAILED DESCRIPTION OF THE INVENTION

Several embodiments will be described below with reference to the accompanying drawings.

First Embodiment

First, a semiconductor device will be described with reference to FIG. 1.

Figure 1:
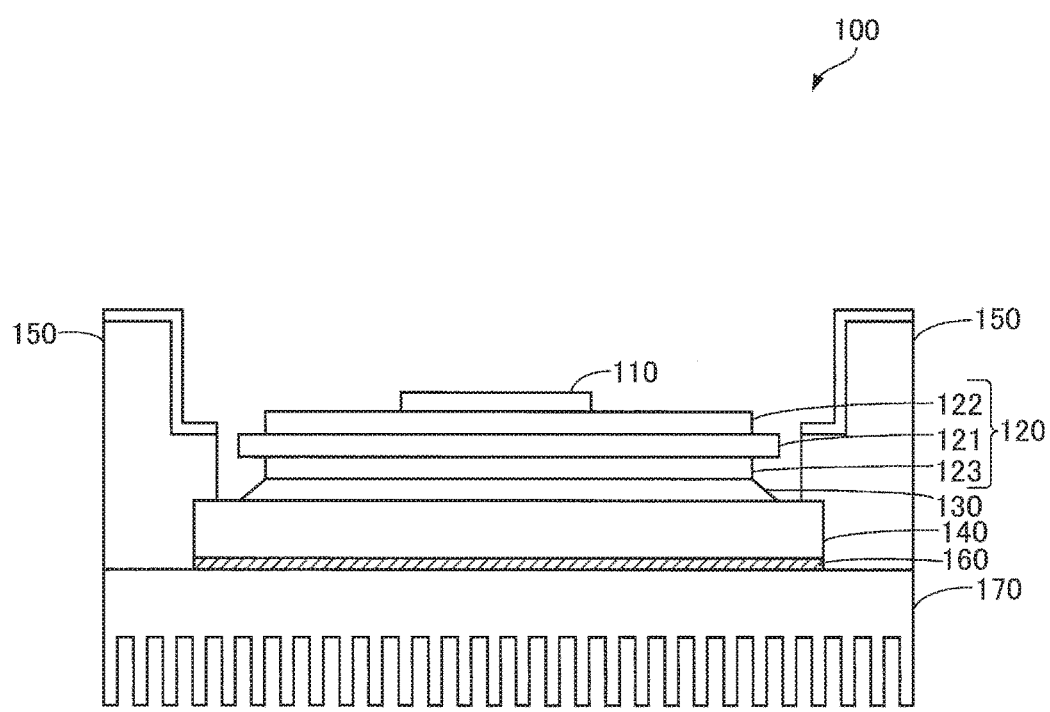
FIG. 1 depicts a semiconductor device according to a first embodiment.

FIG. 1 depicts a semiconductor device according to the first embodiment.

In a semiconductor device 100, a semiconductor chip 110, a laminated substrate 120, and a heat-dissipating base 140 are laminated and housed in a case 150, with the semiconductor chip 110, the laminated substrate 120, and the front surface of the heat-dissipating base 140 being sealed by resin (not illustrated).

As examples, the semiconductor chip 110 includes semiconductor elements such as IGBT (Insulated Gate Bipolar Transistors), power MOSFET (Metal Oxide Semiconductor Field Effect Transistors), and FWD (Free Wheeling Diodes). Note that although only one semiconductor chip 110 is depicted in FIG. 1, a plurality of semiconductor chips 110 may be disposed as needed.

The laminated substrate 120 includes an insulating board 121, a conductive circuit board 122 that is formed on a front surface of the insulating board 121, and a metal plate 123 that is formed on a rear surface of the insulating board 121. On the laminated substrate 120, the semiconductor chip 110 is provided via solder (not illustrated) on the conductive circuit board 122.

The heat-dissipating base 140 is made of metal with high thermal conductivity, such as aluminum, gold, silver, or copper, and is subjected to a plating process that forms a plating layer (not illustrated) on the surface. The laminated substrate 120 is provided via solder on a front surface of the heat-dissipating base 140. A plurality of depressions are formed in a rear surface of the heat-dissipating base 140 by a shot peening process, which works the surface into a structure where a plurality of depressions overlap one another, thereby forming a hardened layer (not illustrated). Note that the method of forming a hardened layer on the rear surface of the heat-dissipating base 140 is described in detail later in this specification. Note that the expression "front surface" of the insulating board 121 refers to the surface on the side where the circuit board 122 is formed in FIG. 1, and the expression "rear surface" of the heat-dissipating base 140 is the surface on the opposite side to the side where the laminated substrate 120 is formed in FIG. 1.

Note that electrical connections are made inside the semiconductor chip 110 and between main electrodes of the semiconductor chip 110 and terminals on the case 150 using wires (not illustrated).

The semiconductor device 100 with the configuration described above has heat-dissipating fins 170 provided via a thermal compound 160 on the rear surface of the heat-dissipating base 140. The heat-dissipating fins 170 are made of metal with high thermal conductivity, such as aluminum, gold, silver, or copper, and are attached to the rear surface of the heat-dissipating base 140 using screws (not illustrated) with the thermal compound 160 in between. The thermal compound 160 tightly attaches the heat-dissipating base 140 and the heat-dissipating fins 170 and is used to achieve favorable thermal conductivity between the heat-dissipating base 140 and the heat-dissipating fins 170. It is therefore important to ensure that there are no voids. When the heat-dissipating base 140 is warped and/or the rear surface of the heat-dissipating base 140 is not flat, gaps are produced between the heat-dissipating base 140 and the heat-dissipating fins 170. This results in an increase in the thickness of the thermal compound and/or the production of voids, which are undesirable due to a drop in thermal conductivity.

Note that as examples, the thermal compound 160 includes non-silicone organic oil and a filler carried in the organic oil. Note that aluminum oxide or the like that has high thermal conductivity and is an insulator is used as the filler. The fill rate of the filler is equal to or greater than 80 wt % and equal to or less than 95 wt %, and the mean diameter of the filler is 5 µm. The thermal conductivity of the thermal compound 160 is 1.99 W/(m·K) and the viscosity is 542 Pas (at a rotation speed of 0.3 rpm) and 112 Pa·s (at a rotation speed of 3 rpm). The thermal compound 160 is applied with a thickness of around 100 µm on the heat-dissipating base 140.

A method of forming a hardened layer on the rear surface of the heat-dissipating base 140 by way of a shot peening process will now be described in detail with reference to FIGS. 2A and 2B.

Figure 2A:
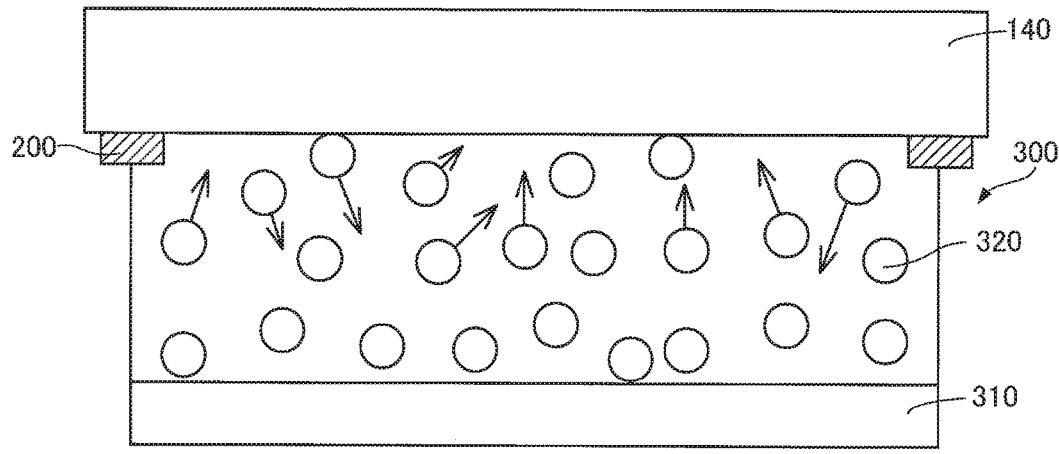
FIGS. 2A and 2B each depict a shot peening process according to the first embodiment.
Figure 2B:
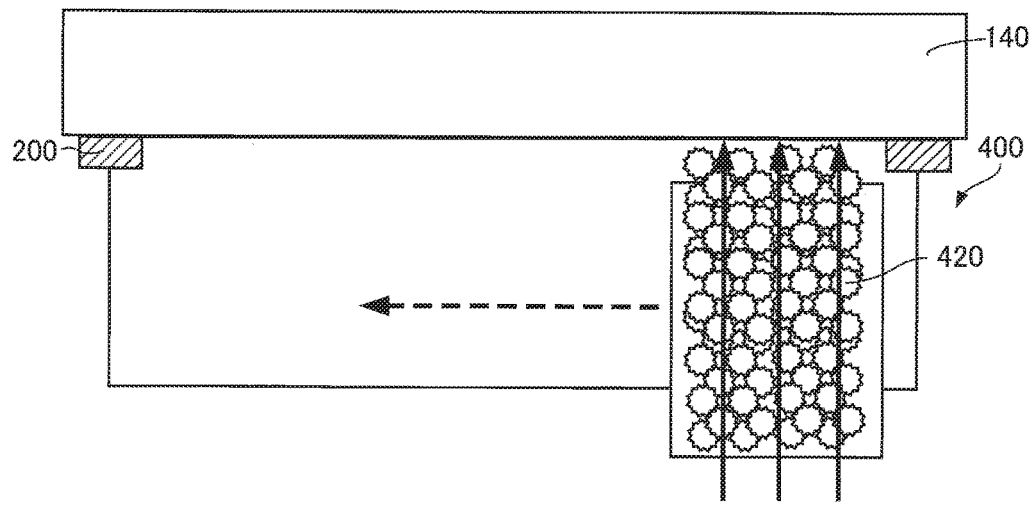

FIGS. 2A and 2B depict the shot peening processes according to the first embodiment.

A shot peening process where shot media are propelled by ultrasonic vibration is depicted in FIG. 2A and a shot peening process where shot media are propelled by air pressure is depicted in FIG. 2B.

A structure with a plurality of overlapping depressions is formed in the rear surface of the heat-dissipating base 140 of the semiconductor device 100 by a shot peening (SP) process.

First, to perform the shot peening process on the rear surface of the heat-dissipating base 140, as one example, as depicted in FIG. 2A, a shot peening apparatus 300 is set up in a machined region where the plurality of depressions are to be formed, the region being indicated by a mask 200 on the rear surface of the heat-dissipating base 140.

The shot peening apparatus 300 includes an ultrasonic vibration apparatus 310 and a plurality of shot media 320 that are vibrated by the ultrasonic vibration apparatus 310.

With this shot peening apparatus 300, the ultrasonic vibration apparatus 310 is driven to vibrate the shot media 320. The vibrating shot media 320 impact the rear surface of the heat-dissipating base 140 to form a plurality of depressions in the rear surface of the heat-dissipating base 140. In the region in which a plurality of overlapping depressions are formed, the increase in surface area and hardening result in the formation of a hardened layer. This hardened layer is a layer with a thickness in a range of several microns to several tens of microns in the thickness direction of the heat-dissipating base 140. In the region subjected to the shot peening process, compressive stress also acts due to the hardened layer, resulting in warping of the heat-dissipating base 140. More specifically, when the hardened layer is on the bottom, the heat-dissipating base 140 becomes downwardly convex. The depth, width, number, and the like of the depressions formed in the rear surface of the heat-dissipating base 140 are controlled by changing the amplitude of the ultrasonic vibration and the form, mean particle diameter, and the like of the shot media.

Alternatively, to perform a shot peening process on the rear surface of the heat-dissipating base 140, as another example, as depicted in FIG. 2B, a shot peening apparatus 400 is set up for the region where the plurality of depressions are to be formed, the region being indicated by the mask 200 on the rear surface of the heat-dissipating base 140.

The shot peening apparatus 400 includes a plurality of shot media 420 that are propelled by air pressure.

With this shot peening apparatus 400, by blowing out the shot media 420 using air pressure, the shot media 420 are shot out of the shot peening apparatus 400 (in the direction of the solid arrows in the drawing). Due to the propelled shot media 420 impacting the rear surface of the heat-dissipating base 140, a plurality of depressions are formed in the rear surface of the heat-dissipating base 140 to form a structure with a plurality of overlapping depressions. In the region where the plurality of depressions are formed, the increase in surface area and hardening result in the formation of a hardened layer. When the shot peening process by the shot peening apparatus 400 ends, the shot peening apparatus 400 is moved in the direction of the broken arrow in the drawing and the shot peening process is performed once again. In this way, it is possible to perform the shot peening process on the entire rear surface of the heat-dissipating base 140 that is indicated by the mask 200. The depth, width, number, and the like of the depressions formed in the rear surface of the heat-dissipating base 140 are controlled based on the air pressure of the shot peening apparatus 400 and the form, mean particle diameter, and the like of the shot media.

Due to the shot media propelled by ultrasonic vibration or air pressure impacting the heat-dissipating base 140, this shot peening process forms a hardened layer. Due to the action of compressive stress, the heat-dissipating base 140 is caused to warp, which achieves an initial warping.

Note that when the shot media are SUS304 and are propelled by ultrasonic vibration, the mean particle diameter of the shot media has a maximum of around 4 mm, while when the shot media are propelled by ultrasonic vibration, the mean particle diameter has a maximum of around 1.2 mm. Accordingly, it is possible to use shot media with a larger mean particle diameter (i.e., heavier shot media) when ultrasonic vibration is used compared to when air pressure is used. On the other hand, when ultrasonic vibration is used and the mean particle diameter of the shot media is too small, the rear surface of the heat-dissipating base 140 is abraded. Typically, when shot media impact a metal plate such as the heat-dissipating base 140, residual stress, such as compressive stress, is formed in the metal surface, and there is also an action of abrading the metal. When the mean particle diameter of the shot media is too small, the latter action of abrading the metal becomes more prominent. Accordingly, there are cases where this is undesirable since achieving a predetermined residual stress will result in the metal being abraded. When air pressure is used, shot media that are too heavy fail to be propelled by the available air pressure.

Next, examples of the shot media used in the shot peening process will be described with reference to FIGS. 3A to 3C.

Figure 3A:
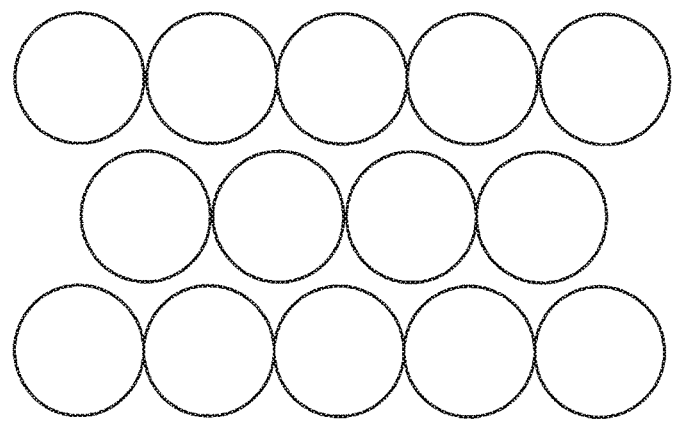
FIGS. 3A to 3C depict examples of shot media used in the shot peening process according to the first embodiment.
Figure 3B:
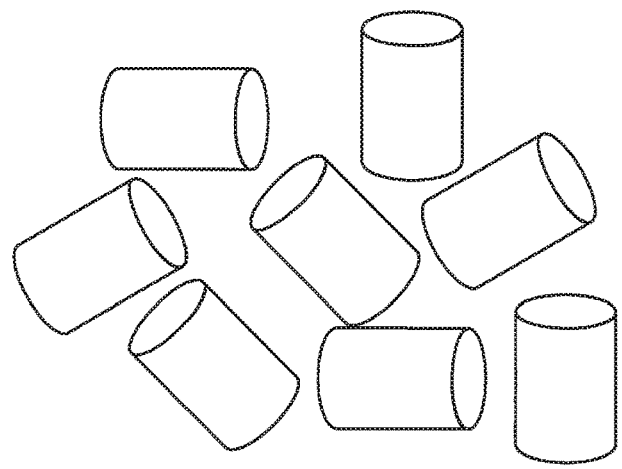
Figure 3C:
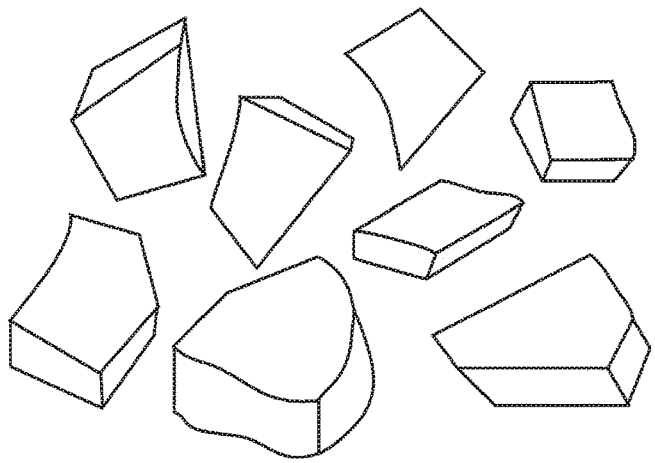

FIGS. 3A to 3C depict examples of shot media used in the shot peening process according to the first embodiment.

The shape of the shot media has three main types.

As depicted in FIG. 3A, one example is shot media that are spherical (spheres).

As depicted in FIG. 3B, another example is shot media that are cylindrical, such as cut pieces of wire.

As depicted in FIG. 3C, another example is shot media that are block fragments that have a plurality of points on their surfaces.

Note that when the shot media are cylindrical or block fragments, since a plurality of points are present on the surface, it is possible to abrade the processed material more than when spherical shot media are used. Shot media that are cylindrical or in the form of block fragments are also less expensive than spherical shot media.

Next, the method of manufacturing the semiconductor device 100 will be described with reference to FIG. 4.

Figure 4:
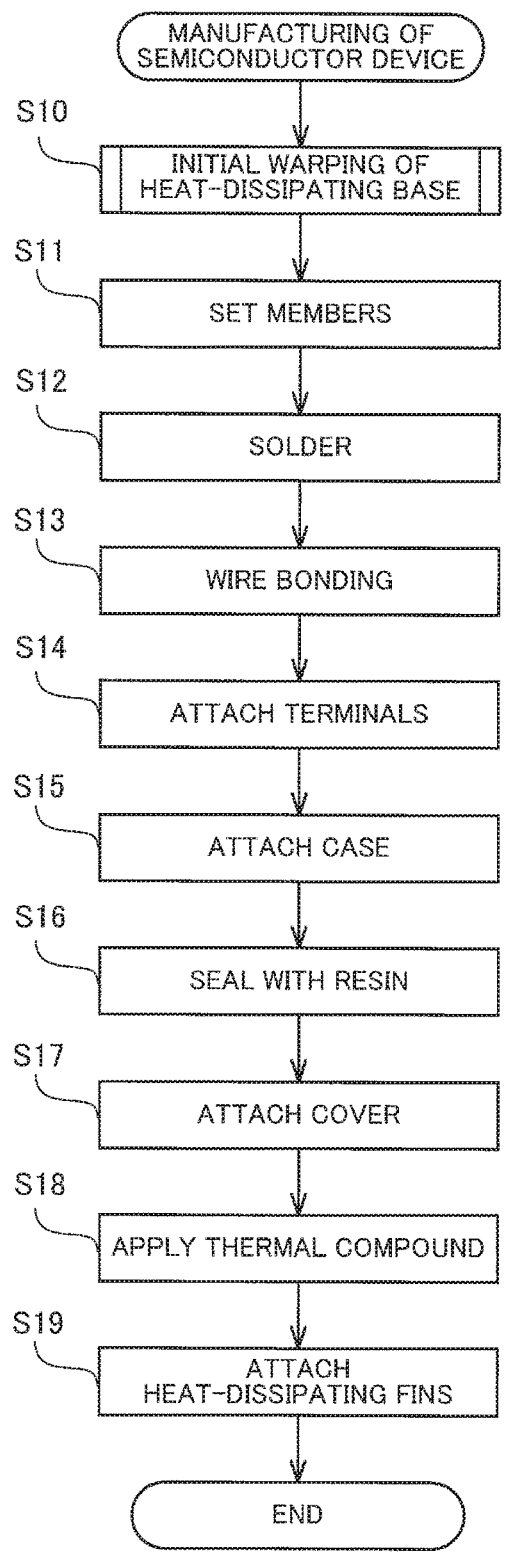
FIG. 4 is a flowchart depicting a method of manufacturing a semiconductor device according to the first embodiment.

FIG. 4 is a flowchart depicting a method of manufacturing a semiconductor device according to the first embodiment. Note that the respective processes in FIG. 4 are executed by a manufacturer of the semiconductor device 100 and a manufacturing apparatus that is operated by the manufacturer.

[Step S10] The heat-dissipating base 140 is prepared. A plating process is then performed on the surface of the prepared heat-dissipating base 140. Before or after this plating process, a shot peening process is performed on the rear surface of the heat-dissipating base 140 to cause an initial warping that makes the heat-dissipating base 140 concave. This initial warping of the heat-dissipating base 140 is provided in advance before the semiconductor chip 110, the laminated substrate 120 and the heat-dissipating base 140 are laminated in view of the upwardly convex warping of the heat-dissipating base 140 that will occur due to the differences in the thermal expansion coefficient between the different members when the semiconductor chip 110, the laminated substrate 120, and the heat-dissipating base 140 are subsequently laminated with solder in between and heated to solder the members together. The degree of warping that occurs when the laminated substrate 120 and/or the semiconductor chip 110 are mounted on the heat-dissipating base 140 when the heat-dissipating base 140 has not been provided with an initial warping will differ according to the type of semiconductor device 100. For this reason, the degree of warping is measured in advance, and the heat-dissipating base 140 is provided with a predetermined degree of warping. Note that one method of providing the initial warping is to place the heat-dissipating base 140 in a mold of a predetermined shape and then apply pressure to cause deformation. However, to provide different degrees of warping for each type of semiconductor device 100 according to this method, there is a need to prepare a large number of molds. It is also difficult to control the degree of warping with high precision. For this reason, a method capable of providing a degree of warping with high precision in accordance with the type of semiconductor device 100 is used.

Note that even when the laminated substrate 120 is provided on the front surface of the heat-dissipating base 140 as described later, the expression "upwardly convex" refers to a state where the rear surface is depressed toward the front surface of the heat-dissipating base 140 and the expression "downwardly convex" refers to a state where the front surface of the heat-dissipating base 140 is depressed.

Note that the processing in step S10 is described in detail later.

[Step S11] The various members are set by providing the laminated substrate 120 via a solder plate on the heat-dissipating base 140 and providing the semiconductor chip 110 via a solder plate on the circuit board 122 of the laminated substrate 120.

[Step S12] Heating is performed to melt the solder plates interposed between the semiconductor chip 110, the laminated substrate 120, and the heat-dissipating base 140, and by allowing the melted solder to harden, the semiconductor chip 110, the laminated substrate 120, and the heat-dissipating base 140 are soldered together.

At this time, due to the heating, the heat-dissipating base 140, which was provided with downwardly convex warping, warps so as to become upwardly convex. By doing so, the warping of the heat-dissipating base 140 becomes substantially horizontal, thereby suppressing the overall warping of the heat-dissipating base 140.

[Step S13] Wiring connections are made by performing wire bonding on the semiconductor chip 110.

[Step S14] Terminals are attached to the case 150.

[Step S15] The semiconductor chip 110, the laminated substrate 120, and the heat-dissipating base 140 that were set in step S11 are housed in the case 150 and bonded to the case 150 to assemble the semiconductor device 100.

Note that the rear surface of the heat-dissipating base 140 is exposed at a rear surface side of the case 150.

[Step S16] Inside the case 150, the semiconductor chip 110, the laminated substrate 120, and the front surface of the heat-dissipating base 140 are sealed by resin.

[Step S17] The terminals of the case 150 are bent and a cover is attached.

[Step S18] Thermal compound is applied to produce a thickness of around 100 μm on the rear surface of the heat-dissipating base 140.

[Step S19] The heat-dissipating fins 170 are attached to the rear surface of the heat-dissipating base 140 onto which the thermal compound 160 has been applied and the heat-dissipating fins 170 are fixed to the heat-dissipating base 140 by screws. Note that step S13 may be performed after step S15.

At this time, since warping of the heat-dissipating base 140 is suppressed, the production of gaps between the heat-dissipating base 140 and the heat-dissipating fins 170 that have been attached via the thermal compound 160 is also suppressed. In this way, when the heat-dissipating base 140 and the heat-dissipating fins 170 are attached via the thermal compound 160, a drop in heat dissipation from the heat-dissipating base 140 to the heat-dissipating fins 170 is suppressed.

By performing the above steps, the semiconductor device 100 to which the heat-dissipating fins 170 have been attached is manufactured.

Next, the initial warping of the heat-dissipating base 140 will be described with reference to FIGS. 5 and 6.

Figure 5:
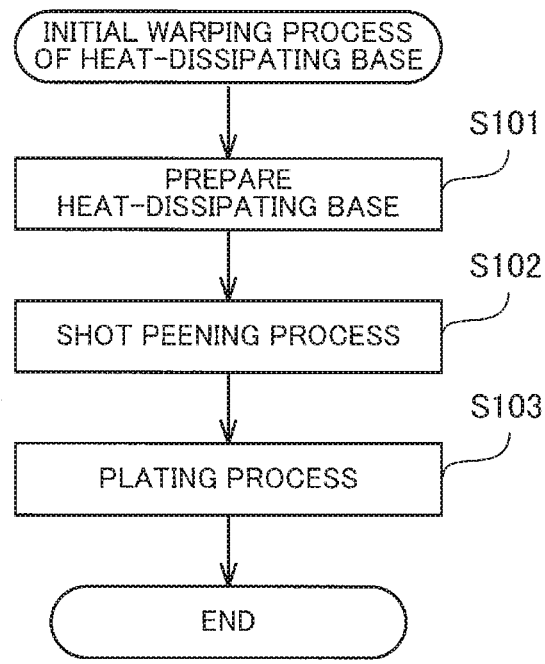
FIG. 5 is a flowchart depicting initial warping of a heat-dissipating base of a semiconductor device according to the first embodiment.

FIG. 5 is a flowchart depicting initial warping of the heat-dissipating base of the semiconductor device according to the first embodiment.

Figure 6A:
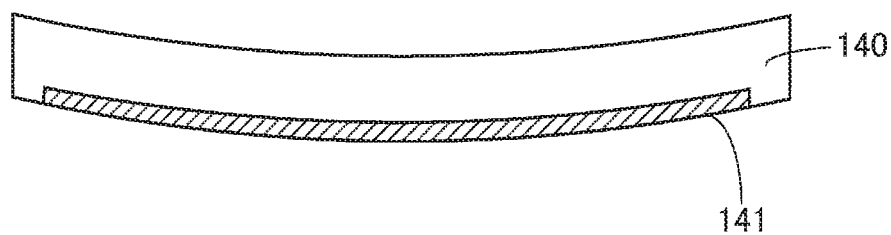
FIGS. 6A and 6B depict the heat-dissipating base of the semiconductor device according to the first embodiment.
Figure 6B:
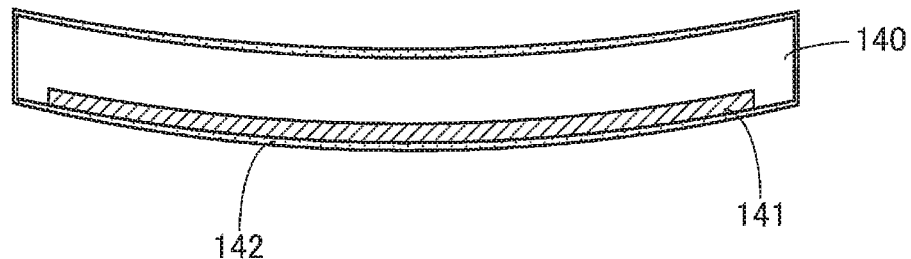

FIGS. 6A and 6B depict the heat-dissipating base of the semiconductor device according to the first embodiment.

Note that FIG. 6A depicts the heat-dissipating base 140 that has been subjected to the shot peening process and FIG. 6B depicts the heat-dissipating base 140 that has been subjected to the shot peening process and has been further subjected to a plating process.

[Step S101] The heat-dissipating base 140 is prepared.

[Step S102] The shot peening process is performed on the rear surface of the heat-dissipating base 140. By doing so, a plurality of depressions are formed in the rear surface of the heat-dissipating base 140 to produce a structure with a plurality of overlapping depressions. By doing so, as depicted in FIG. 6A, a hardened layer 141 is formed on the rear surface side of the heat-dissipating base 140 that was subjected to a shot peening process, which provides compressive stress and produces concave initial warping.

[Step S103] The heat-dissipating base 140 that has been provided with initial warping in this way is subjected to a plating process that uses nickel, for example, as the metal material to form a plating layer 142 on the surface of the heat-dissipating base 140 as depicted in FIG. 6B. Note that the thickness of the plating layer is equal to or greater than 1 μm and equal to or smaller than around 10 μm, with an average of around, for example, 5 μm. As examples of the method used in the plating process, it is possible to use electrolytic plating or electroless plating. A plating thickness that is too great is undesirable since plating nodules (abnormal precipitation) and defects may be produced and/or large convexes and concaves may be formed. The plating thickness also has an in-plane distribution, and if the thickness is too thick, there will be large differences in the thickness, which is undesirable from the viewpoints of stress and heat conduction. Thick plating is also undesirable from a cost viewpoint. On the other hand, when the plating thickness is too thin, there is the risk of a drop in antioxiding performance and anticorrosion performance. For this reason, an appropriate plating thickness is used.

Due to the formation of the plating layer 142, the heat-dissipating base 140 has improved antioxiding performance and anticorrosion performance, and is easy to solder to the laminated substrate 120. To provide such functions, the plating process is performed on the heat-dissipating base 140.

As a result of the processes in steps S101 to S103 (step S10) described above, initial warping is performed for the heat-dissipating base 140 that has been subjected to a plating process.

Since the shot peening process is performed on the heat-dissipating base 140 before the plating process, the plating layer 142 of the heat-dissipating base 140 does not become damaged. Since the plating layer 142 is formed in the heat-dissipating base 140 in the form of a structure in which a plurality of overlapping depressions are formed by the shot peening process, the plurality of overlapping depressions produces an anchoring effect for the plating layer 142, which improves the adhesion of the plating layer 142 to the heat-dissipating base 140. It is also possible to use shot media of a variety of shapes and materials.

Next, the warping of the heat-dissipating base 140 and the adhesion of the plating layer 142 to the heat-dissipating base 140 when the shot peening process has been performed using a variety of shot media will be described with reference to FIG. 7.

FIG. 7 depicts a heat-dissipating base when a variety of shot media have been used in a shot peening process according to the first embodiment.

Note that "shot media (shape, mean particle diameter (mm))", "SP (Shot Peening) process type", "arithmetic mean roughness Ra (μm) (of the rear surface of the heat-dissipating base that has been subjected to the shot peening process)", "warping", and "adhesion of the plating layer" columns are given in FIG. 7.

The "shot media (shape, mean particle diameter (mm))" column expresses the shape and mean particle diameter of the shot media used in the shot peening process.

The "SP process type" column expresses the process type ("ultrasonic vibration" or "air pressure") used when performing the shot peening process.

The "arithmetic mean roughness Ra (μm)" column expresses the arithmetic mean roughness of the rear surface of the heat-dissipating base 140 that has been subjected to the shot peening process.

The "warping" column expresses the warped state of the heat-dissipating base 140 that has been subjected to the shot peening process. As examples, the entry "G (Good)" is used when appropriate warping of the heat-dissipating base 140 has been produced by the shot peening process and the entry "P (Poor)" is used when sufficient warping has not been produced.

The "adhesion of the plating layer" column expresses the state of the adhesion of the plating layer 142 to the heat-dissipating base 140. Note that the plating thickness has a mean value of 5 μm. As one example, the entry "G (Good)" is used when the adhesion of the plating layer to the heat-dissipating base 140 on which the shot peening process has been performed has improved beyond the adhesion of the plating layer 142 to a heat-dissipating base 140 on which a shot peening process has not been performed, and the entry "N (No)" is used when the adhesion has not improved (i.e., when the adhesion is poor). Adhesion was evaluated according to a JIS H8504 bending test.

Here, SUS304 is used as the "shot media" and spherical, cylindrical or block fragments are used as the "shape".

As the shot peening process that uses these shot media, air pressure is used for shot media with a mean particle diameter of 1 mm or below and ultrasonic vibration is used for shot media with a mean particle diameter of over 1 mm.

Note that when air pressure is used, the propelling pressure is set at 0.5 MPa and the propelling time is set at 92 seconds. On the other hand, when ultrasonic vibration is used, the vibration amplitude is 70 μm and the vibration time is set at 20 seconds.

From FIG. 7, it can be understood that sufficient warping is produced in the heat-dissipating base 140 when the mean particle diameter of spherical shot media is 1 mm and when the mean particle diameter of block fragments is equal to or greater than 0.2 mm and equal to or smaller than 5 mm. It is believed that since the shot peening process is directly performed on the rear surface of the heat-dissipating base 140 before the plating process, stress is uniformly introduced into the rear surface of the heat-dissipating base 140. When the shot peening process is performed with shot media with a mean particle diameter of equal to or greater than 0.2 mm and equal to or smaller than 5 mm on a heat-dissipating base 140 that has been subjected to the plating process, due to the fluctuations in the thickness of the plating layer, it is not possible for the shot media to impact the heat-dissipating base 140 uniformly.

Also, according to FIG. 7, when the shot media is cylindrical and has a mean particle diameter of 0.1 mm that is smaller than 0.2 mm, it is not possible to cause sufficient warping of the heat-dissipating base 140. It is believed that this is because the mean particle diameter of the shot media is too small, so that it is not possible to provide sufficient depressions in the heat-dissipating base 140 which in turn does not cause sufficient warping of the heat-dissipating base 140. With shot media in the form of block fragments with a mean particle diameter of 8 mm that is larger than 5 mm, in the same way as described above, it is not possible to cause sufficient warping of the heat-dissipating base 140. It is believed that this is caused by fluctuations being produced in the depressions in the heat-dissipating base 140, which prevent stress from being uniformly introduced, resulting in non-uniform warping.

It can also be understood that by performing the shot peening process with the spherical and block fragment-type shot media described above with a mean particle diameter of equal to or greater than 0.2 mm and equal to or smaller than 5 mm, the adhesion of the plating layer is improved. This is because a plurality of depressions are formed in the rear surface by the shot peening process, thereby forming a structure with a plurality of overlapping depressions (an arithmetic mean roughness of equal to or greater than 1.04 μm and equal to or smaller than 10.8 μm). This is because the depressions produce an anchoring effect for the plating layer when the plating process is performed on the resulting heat-dissipating base 140. Also, compared to a shot peening process with spherical shot media with a mean particle diameter of 1 mm, a further improvement in adhesion was also observed, even when the arithmetic mean roughness is the same. It is believed that this is due to a plurality of points being present in the surface, which improves the anchoring effect. By improving the adhesion of the plating layer to the heat-dissipating base 140, the resistance to thermal stress caused by a difference in thermal expansion coefficients between the heat-dissipating base 140 and the plating layer is improved. Note that it is believed that when the shot media are block fragments with a mean particle diameter of 8 mm that is larger than 5 mm, the arithmetic mean roughness will increase, which prevents the formation of a uniform plating layer and results in spots being formed in the plating layer, so that there is no improvement in the adhesion of the plating layer.

The method of manufacturing the semiconductor device 100 described above includes a step of preparing a heat-dissipating base 140, a step of performing a shot peening process on the rear surface of the heat-dissipating base 140, a step of performing a plating process that plates the front surface and rear surface of the heat-dissipating base 140 with a metal material, and a step of heating to solder together the heat-dissipating base 140 that has been subjected to the shot peening process, the laminated substrate 120 that has been disposed via solder 130 on the front surface of the heat-dissipating base 140 and includes the insulating board 121 and the circuit board 122 provided on the front surface of the insulating board 121, and the semiconductor chip 110 that has been disposed via solder on the circuit board 122.

By doing so, since it is possible, before assembly of the semiconductor chip 110, the laminated substrate 120, and the heat-dissipating base 140, to provide the heat-dissipating base 140 with initial (concave) warping via the shot peening process, the semiconductor chip 110 and the solder 130 are prevented from being damaged. In addition, even if the heat-dissipating base 140 warps so as to become upwardly convex due to the differences in thermal expansion coefficients between the members when heating is performed to solder the semiconductor chip 110, the laminated substrate 120, and the heat-dissipating base 140, since the heat-dissipating base 140 will have been provided with the initial (concave) warping, the warping of the heat-dissipating base 140 is corrected so as to become substantially horizontal. Accordingly, the thickness of the thermal compound 160 between the heat-dissipating base 140 and the heat-dissipating fins 170 is substantially uniform, which prevents a drop in heat dissipation from the heat-dissipating base 140 to the heat-dissipating fins 170. This means that a drop in heat dissipation by the semiconductor device 100 is avoided and the reliability of the semiconductor device 100 is maintained.

Since the plating process is performed on the heat-dissipating base 140 after the shot peening process has been performed on the heat-dissipating base 140, cracking and peeling of the plating layer 142 formed on the heat-dissipating base 140 is avoided and adhesion of the plating layer to the heat-dissipating base 140 is improved.

In particular, when the mean particle diameter of spherical shot media in the shot peening process is 1 mm, or when the mean particle diameter of block fragment shot media is equal to or greater than 0.2 mm and equal to or smaller than 5 mm, sufficient warping is produced in the heat-dissipating base 140 and the adhesion of the plating layer 142 to the heat-dissipating base 140 is improved.

Second Embodiment

As a second embodiment, a configuration where a shot peening process is performed after a plating process has been performed on the heat-dissipating base 140 is described.

In this second embodiment also, like the first embodiment, the semiconductor device 100 (see FIG. 1) is manufactured according to the flowchart of the method of manufacturing the semiconductor device 100 depicted in FIG. 4.

An initial warping process of the heat-dissipating base in step S10 in the flowchart in FIG. 4 for the case of the second embodiment will now be described with reference to FIGS. 8 and 9.

Figure 8:
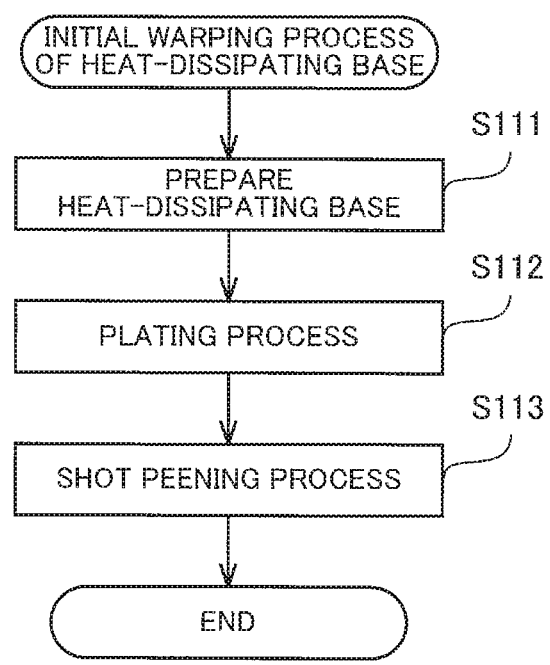
FIG. 8 is a flowchart depicting the initial warping of a heat-dissipating base of a semiconductor device according to a second embodiment.

FIG. 8 is a flowchart depicting the initial warping of the heat-dissipating base of a semiconductor device according to the second embodiment.

Figure 9A:
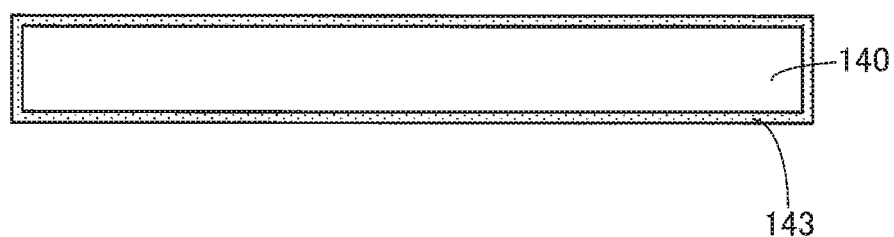
FIGS. 9A and 9B depict the heat-dissipating base of the semiconductor device according to the second embodiment.
Figure 9B:
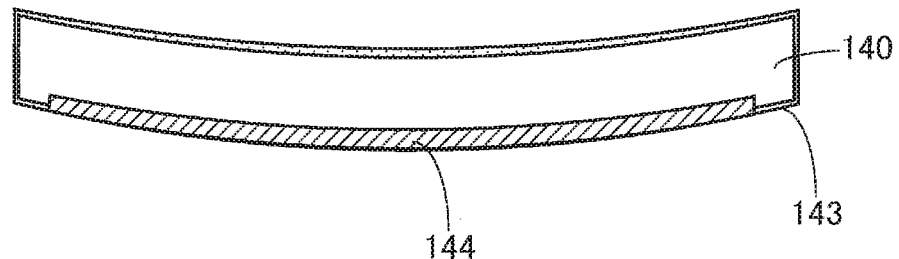

FIGS. 9A and 9B depict the heat-dissipating base of the semiconductor device according to the second embodiment.

Note that FIG. 9A depicts a heat-dissipating base 140 that has been subjected to a plating process and FIG. 9B depicts a heat-dissipating base 140 that has been subjected to a plating process and then subjected to a shot peening process.

[Step S111] The heat-dissipating base 140 is prepared.

[Step S112] The plating process is performed on the heat-dissipating base 140 so that as depicted in FIG. 9A, the plating layer 143 is formed on the surface of the heat-dissipating base 140. The thickness of the plating layer 143 is equal to or greater than 2 μm and equal to or smaller than 10 μm. The thickness of the plating layer 143 is described later.

[Step S113] The shot peening process is performed on the rear surface of the heat-dissipating base 140 on which the plating layer 143 has been formed. By doing so, a plurality of depressions are formed in the rear surface of the heat-dissipating base 140 to form a structure where a plurality of depressions are overlapping. Since the aluminum or copper that is the base material of the heat-dissipating base 140 is soft compared to the plating layer 143 made of nickel or the like, the base material deforms to form a hardened layer in the base material. By doing so, as depicted in FIG. 9B, a hardened layer 144 is formed on the heat-dissipating base 140 by increasing the surface area on the rear surface side where the shot peening process was performed and a concave initial warping is produced.

Note here that the shot media and processing conditions are selected for the shot peening process in step S113 so that there is no abrading or peeling of the plating layer 143 formed on the heat-dissipating base 140.

The shot peening process is also performed on the heat-dissipating base 140 in a manner that prevents cracking and peeling of the plating layer 143. Although an optimal range for the plating thickness exists as described earlier, a minimum thickness exists for the plating layer 143, for example, a thickness of at least 2 μm (according to this second embodiment, about equal to or greater than 2 μm and equal to or smaller than 10 μm). That is, when the thickness of the plating layer 143 is below 2 μm (according to the first embodiment, about equal to or greater than 1 μm and smaller than 2 μm), it is instead desirable to perform the plating process after first performing the shot peening process on the heat-dissipating base 140 as described above in the first embodiment.

By the processing in steps S111 to S113 (step S10), an initial warping is applied to the heat-dissipating base 140 and in the same way as the first embodiment, the processing in step S11 of the flowchart in FIG. 4 is started.

Next, the warped state of the heat-dissipating base 140 and the adhesion of the plating layer 143 to the heat-dissipating base 140 for a case where the shot peening process has been performed using a variety of shot media on the heat-dissipating base 140 that has been subjected to the plating process will be described with reference to FIG. 10.

FIG. 10 depicts a heat-dissipating base in a case where a variety of shot media have been used in the shot peening process according to the second embodiment.

Note that "shot media (shape, mean particle diameter (mm))", "SP (Shot Peening) process type", "arithmetic mean roughness Ra (μm) (of the rear surface of the heat-dissipating base 140 that has been subjected to the shot peening process)", "warping", and "adhesion of the plating layer" columns are given in FIG. 10.

The "shot media (shape, mean particle diameter (mm))" column expresses the shape and mean particle diameter of the shot media used in the shot peening process. Note that the mean particle diameter was obtained by observing the various shot media using a SEM (Scanning Electron Microscope), measuring the particle diameters, and calculating the mean.

The "SP process type" column expresses the process type ("ultrasonic vibration" or "air pressure") used when performing the shot peening process.

The "arithmetic mean roughness Ra (μm)" column expresses the arithmetic mean roughness of the rear surface of the heat-dissipating base 140 that has been subjected to the shot peening process, and was measured using a stylus-type surface roughness meter. Measurement was performed with measurement conditions where the cutoff length is 2.5 mm, the measurement length is 12.5 mm, the measurement speed is 0.3 mm/s, and the cutoff type is "Gaussian".

The "warping" column expresses the warped state of the heat-dissipating base 140 that has been subjected to the shot peening process. As examples, the entry "G (Good)" is used when appropriate warping of the heat-dissipating base 140 has been produced by the shot peening process, the entry "P (Poor)" is used when sufficient warping has not been produced.

The "adhesion of the plating layer" column expresses the state of the adhesion of the plating layer 143 to the heat-dissipating base 140. Note that the plating thickness has a mean value of 5 μm. As one example, the entry "G (Good)" is used when the adhesion of the plating layer to the heat-dissipating base 140 on which the shot peening process has been performed has improved beyond the adhesion of the plating layer to a heat-dissipating base 140 on which the shot peening process has not been performed, the entry "P (Poor)" is used when the adhesion has not sufficiently improved, and the entry "N (No)" is used when the adhesion has not improved (i.e., when the adhesion is poor). Adhesion was evaluated according to a JIS H8504 bending test.

Also, SUS304 is used as the "shot media" and spherical and cylindrical are used as the "shape". Note that since shot media in the form of block fragments have points on the surface, there is the risk of the plating layer 143 of the heat-dissipating base 140 being abraded, resulting in cracking, peeling, and the like of the plating layer 143. For this reason, shot media in the form of block fragments are not used.

As the shot peening process that uses these shot media, air pressure is used for shot media with a mean particle diameter of 1 mm or below and ultrasonic vibration is used for shot media with a mean particle diameter of over 1 mm.

Note that when air pressure is used, the propelling pressure is set at 0.5 MPa and the propelling time is set at 92 seconds. On the other hand, when ultrasonic vibration is used, the vibration amplitude is 70 μm and the vibration time is set at 20 seconds.

From FIG. 10, it can be understood that appropriate warping is produced in the heat-dissipating base 140 (with no cracking, peeling, or the like of the plating layer 143) when the shot media are spherical and the mean particle diameter is equal to or greater than 0.6 mm and equal to or smaller than 10 mm. It is believed that the heat-dissipating base 140 that has been subjected to the plating process is appropriately impacted by the shot media via the plating layer 143 without cracking, peeling, or the like of the plating layer 143.

When spherical shot media has a mean particle diameter of 0.2 mm, appropriate warping of the heat-dissipating base 140 did not occur. It is believed that since the mean particle diameter of the shot media is small, the shot media did not sufficiently impact the heat-dissipating base 140. Note that when the mean particle diameter of spherical shot media is small, in addition to the problem of not producing warping in the heat-dissipating base 140, there is also the risk of abrading of the plating layer 143, resulting in peeling, cracking, and the like of the plating layer 143.

In addition, it is understood that a shot peening process with shot media that are spherical and have a mean particle diameter that is equal to or greater than 0.6 mm and equal to or smaller than 10 mm as described above improves the adhesion of the plating layer 143. It is believed that this is because this type of shot media and these processing conditions in the shot peening process on the heat-dissipating base 140 that has been subjected to the plating process are not sufficient to cause cracking, peeling, and the like of the plating layer 143 which would lower the adhesion. Note that since the plating layer 143 is formed on the flat heat-dissipating base 140 that is not warped, the plating layer 143 is uniformly formed on the heat-dissipating base 140.

Note that when the shot media are cylindrical and the mean particle diameter is 0.6 mm, no improvement in the adhesion of the plating layer 143 was observed. It is believed that the corners of cylindrical shot members abrade the plating layer 143 of the heat-dissipating base 140 and cause cracking, peeling, and the like of the plating layer 143. It is believed that the same phenomenon will occur with block fragments. With spherical shot media also, when the mean particle diameter is 12 mm, no improvement in the adhesion of the plating layer 143 was observed. It is believed that when a shot peening process with spherical shot media is performed on the heat-dissipating base 140 that has been subjected to the plating process, although warping of the heat-dissipating base 140 will occur due to the shot media having a mean particle diameter of a certain size (in this case, 12 mm), cracking, peeling, and the like of the plating layer 143 is also caused by the excessive size of the shot media, resulting in a drop in adhesion.

Also, when a concave initial warping is produced by the shot peening process in the heat-dissipating base 140 that has been subjected to the plating process, stress is produced in the plating layer 143. However, when the heat-dissipating base 140 in which the concave initial warping is produced is integrated with the semiconductor chip 110 and the laminated substrate 120 and heated to solder the members together, the heat-dissipating base 140 warps so as to become upwardly convex, which means that overall warping of the heat-dissipating base 140 is suppressed. At this time, since the warping of the heat-dissipating base 140 is corrected so as to become substantially horizontal, the stress that was produced in the plating layer 143 of the heat-dissipating base 140 is eliminated. This means that when the heat-dissipating base 140 is integrated as the semiconductor device 100, the structure is resistant to peeling or the like of the plating layer 143 from the heat-dissipating base 140.

The method of manufacturing the semiconductor device 100 described above includes a step of preparing a heat-dissipating base 140, a step of performing a plating process that plates the front surface and rear surface of the heat-dissipating base 140 with a metal material, a step of performing a shot peening process on the rear surface of the heat-dissipating base 140, and a step of heating to solder together the heat-dissipating base 140 that has been subjected to the shot peening process, the laminated substrate 120 that has been disposed via the solder 130 on the front surface of the heat-dissipating base 140 and includes the insulating board 121 and the circuit board 122 provided on the front surface of the insulating board 121, and the semiconductor chip 110 that has been disposed via solder 130 on the circuit board 122.

By doing so, it is possible, before assembly of the semiconductor chip 110, the laminated substrate 120, and the heat-dissipating base 140, to provide the heat-dissipating base 140 with initial (concave) warping via the shot peening process, the semiconductor chip 110 and the solder 130 are prevented from being damaged. In addition, even if the heat-dissipating base 140 warps so as to become upwardly convex due to the differences in the thermal expansion coefficient between the members when heating is performed to solder the semiconductor chip 110, the laminated substrate 120, and the heat-dissipating base 140, since the heat-dissipating base 140 will have been provided with the initial (concave) warping, the warping of the heat-dissipating base 140 is corrected so as to become substantially horizontal. Accordingly, the thickness of the thermal compound 160 between the heat-dissipating base 140 and the heat-dissipating fins 170 is substantially uniform, which prevents a drop in thermal conduction from the heat-dissipating base 140 to the heat-dissipating fins 170. This means that a drop in heat dissipation by the semiconductor device 100 is avoided and the reliability of the semiconductor device 100 is maintained.

In the first embodiment, the plating process is performed after the shot peening process. This means that it is possible to improve the adhesion of the plating layer 142 due to an anchoring effect. It is also possible to use a variety of shot media.

In the second embodiment, the shot peening process is performed after the plating process has been performed on the heat-dissipating base 140. For this reason, the shot peening process is performed on the heat-dissipating base 140 so that cracking, peeling, and the like do not occur for the plating layer 143 formed on the heat-dissipating base 140. In this shot peening process, as one example, it is desirable for the shot media to be spherical and to have a mean particle diameter that is equal to or greater than 0.6 mm and equal to or smaller than 10 mm. In this case, appropriate warping is produced in the heat-dissipating base 140 and the adhesion of the plating layer 143 to the heat-dissipating base 140 is improved.

Stress is also produced in the plating layer 143 of the heat-dissipating base 140 that has been provided with an initial warping by the shot peening process. However, when this heat-dissipating base 140 is heated to become integrated in the semiconductor device 100 by being soldered to the semiconductor chip 110 and the laminated substrate 120, upwardly convex warping is produced, which corrects the warping to a substantially horizontal state. This means that the stress in the plating layer 143 of the heat-dissipating base 140 in the semiconductor device 100 is eliminated, which prevents peeling of the plating layer 143 from the heat-dissipating base 140. The antioxiding performance and anticorrosion performance are also satisfactory.

According to the disclosed technology, it is possible to avoid damage to semiconductor chips and to prevent a drop in heat dissipation by a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A method of manufacturing a semiconductor device, comprising:
   preparing a heat-dissipating base that has a front surface and a rear surface;
   performing one of
      a first initial warping including
         performing shot peening on the rear surface of the heat-dissipating base to form a hardened layer, and
         subsequently plating the front surface and the rear surface of the heat-dissipating base, including the hardened layer formed thereon, with a metal material, and
      a second initial warping including
         plating the front surface and the rear surface of the heat-dissipating base with the metal material to form a plating layer, and
         subsequently performing the shot peening on the rear surface of the heat-dissipating base, including the plating layer formed thereon, with the metal material; and
   soldering a laminated substrate, which includes an insulating board and a circuit board provided on a front surface of the insulating board, on the heat-dissipating base after the first or second initial warping at a side of the front surface thereof, and soldering a semiconductor chip on the circuit board.

2. The method of manufacturing a semiconductor device according to claim 1, wherein in the first initial warping, performing the shot peening includes using one of ultrasonic vibration and air pressure to cause shot media to impact the rear surface of the heat-dissipating base.

3. The method of manufacturing a semiconductor device according to claim 2, wherein when the air pressure is used, the shot media has a mean particle diameter of 1 mm or less.

4. The method of manufacturing a semiconductor device according to claim 2, wherein when the ultrasonic vibration is used, the shot media has a mean particle diameter of over 1 mm.

5. The method of manufacturing a semiconductor device according to claim 2, wherein the shot media has a mean particle diameter that is equal to or greater than 0.2 mm and equal to or smaller than 5 mm.

6. The method of manufacturing a semiconductor device according to claim 5, wherein the shot media is of a spherical shape or a shape of block fragments that have a plurality of points on surfaces thereof.

7. The method of manufacturing a semiconductor device according to claim 2, wherein the plating forms a plating layer of the first initial warping that has a thickness of equal to or greater than 1 μm and smaller than 10 μm.

8. The method of manufacturing a semiconductor device according to claim 1, wherein in the second initial warping, the shot peening uses shot media that are spherical.

9. The method of manufacturing a semiconductor device according to claim 8, wherein a mean particle diameter of the shot media is equal to or greater than 0.6 mm and equal to or smaller than 10 mm.

10. The method of manufacturing a semiconductor device according to claim 8, wherein the plating layer formed in the second initial warping has a thickness of equal to or greater than 2 μm and equal to or smaller than 10 μm.

* * * * *